US007718518B2

(12) United States Patent  (10) Patent No.: US 7,718,518 B2
Zagwijn et al. (45) Date of Patent: May 18, 2010

(54) LOW TEMPERATURE DOPED SILICON LAYER FORMATION

(75) Inventors: Peter Marc Zagwijn, Nijkerk (NL); Theodorus Gerardus Maria Oosterlaken, Oudewater (NL); Steven R. A. Van Aerde, Tielt-Winge (BE); Pamela René Fischer, Leuven (BE)

(73) Assignee: ASM International N.V. (NL)

( * ) Notice: Subject to any disclaimer, the term of this patent is extended or adjusted under 35 U.S.C. 154(b) by 185 days.

(21) Appl. No.: 11/640,471

(22) Filed: Dec. 14, 2006

(65) Prior Publication Data

US 2007/0141812 A1 Jun. 21, 2007

Related U.S. Application Data

(60) Provisional application No. 60/750,928, filed on Dec. 16, 2005.

(51) Int. Cl.
  *H01L 21/20* (2006.01)
(52) U.S. Cl. .................. 438/488; 438/491; 438/495; 257/E21.1; 257/E21.101; 257/E21.106
(58) Field of Classification Search ............... 438/479, 438/488, 491, 495, 499, 501, 505, 509, 542, 438/564, 565, 923; 118/715; 257/E21.1, 257/E21.101, E21.106
  See application file for complete search history.

(56) References Cited

U.S. PATENT DOCUMENTS

| 4,188,444 A | 2/1980 | Landau |
| 4,262,631 A | 4/1981 | Kubacki |
| 4,277,320 A | 7/1981 | Beguwala et al. |
| 4,298,629 A | 11/1981 | Nozaki et al. |
| 4,363,828 A | 12/1982 | Brodsky et al. |
| 4,495,218 A | 1/1985 | Azuma et al. |
| 4,585,671 A | 4/1986 | Kitagawa et al. |
| 4,610,859 A | 9/1986 | Miyagawa et al. |
| 4,684,542 A | 8/1987 | Jasinski et al. |

(Continued)

FOREIGN PATENT DOCUMENTS

EP    0 368 651 A2    5/1990

(Continued)

OTHER PUBLICATIONS

Ishihara et al., "Low-temperature chemical-vapor-deposition of silicon-nitride from tetra-silane and hydrogen azide," *Materials Research Society Symposium Proceedings*, vol. 284, p. 3-8 (1993).

(Continued)

*Primary Examiner*—Ha Tran T Nguyen
*Assistant Examiner*—Daniel Whalen
(74) *Attorney, Agent, or Firm*—Knobbe, Martens, Olson & Bear LLP

(57) ABSTRACT

A doped silicon layer is formed in a batch process chamber at low temperatures. The silicon precursor for the silicon layer formation is a polysilane, such as trisilane, and the dopant precursor is an n-type dopant, such as phosphine. The silicon precursor can be flowed into the process chamber with the flow of the dopant precursor or separately from the flow of the dopant precursor. Surprisingly, deposition rate is independent of dopant precursor flow, while dopant incorporation linearly increases with the dopant precursor flow.

31 Claims, 12 Drawing Sheets

U.S. PATENT DOCUMENTS

| | | | |
|---|---|---|---|
| 4,715,937 A | 12/1987 | Moslehi et al. | |
| 4,720,385 A | 1/1988 | Foster | |
| 4,828,224 A | 5/1989 | Crabb et al. | |
| 4,834,020 A | 5/1989 | Bartholomew et al. | |
| 4,851,095 A | 7/1989 | Scobey et al. | |
| 4,855,254 A | 8/1989 | Eshita et al. | |
| 4,891,103 A | 1/1990 | Zorinsky et al. | |
| 5,091,761 A | 2/1992 | Hiraiwa et al. | |
| 5,111,266 A | 5/1992 | Furumura et al. | |
| 5,214,002 A | 5/1993 | Hayashi et al. | |
| 5,221,556 A | 6/1993 | Hawkins et al. | |
| 5,227,329 A | 7/1993 | Kobayashi et al. | |
| 5,287,205 A | 2/1994 | Yamazaki et al. | |
| 5,356,673 A | 10/1994 | Schmitt et al. | |
| 5,356,821 A | 10/1994 | Naruse et al. | |
| 5,389,398 A | 2/1995 | Suzuki et al. | |
| 5,389,570 A | 2/1995 | Shiozawa | |
| 5,453,858 A | 9/1995 | Yamazaki | |
| 5,471,330 A | 11/1995 | Sarma | |
| 5,591,494 A | 1/1997 | Sato et al. | |
| 5,607,724 A | 3/1997 | Beinglass et al. | |
| 5,614,257 A | 3/1997 | Beinglass et al. | |
| 5,648,293 A | 7/1997 | Hayama et al. | |
| 5,656,531 A | 8/1997 | Thakur et al. | |
| 5,695,819 A | 12/1997 | Beinglass et al. | |
| 5,698,771 A | 12/1997 | Shields et al. | |
| 5,700,520 A | 12/1997 | Beinglass et al. | |
| 5,741,330 A | 4/1998 | Brauker et al. | |
| 5,786,027 A | 7/1998 | Rolfson | |
| 5,789,030 A | 8/1998 | Rolfson | |
| 5,837,580 A * | 11/1998 | Thakur et al. | 438/255 |
| 5,849,601 A | 12/1998 | Yamazaki | |
| 5,874,129 A | 2/1999 | Beinglass et al. | |
| 5,876,797 A | 3/1999 | Beinglass et al. | |
| 5,885,869 A | 3/1999 | Turner et al. | |
| 5,907,792 A | 5/1999 | Droopad et al. | |
| 5,916,365 A | 6/1999 | Sherman | |
| 5,959,326 A | 9/1999 | Aiso et al. | |
| 6,015,590 A | 1/2000 | Suntola et al. | |
| 6,027,705 A | 2/2000 | Kitsuno et al. | |
| 6,056,823 A | 5/2000 | Sajoto et al. | |
| 6,083,810 A | 7/2000 | Obeng et al. | |
| 6,087,229 A | 7/2000 | Aronoqitz et al. | |
| 6,103,600 A | 8/2000 | Ueda et al. | |
| 6,136,654 A | 10/2000 | Kraft et al. | |
| 6,159,828 A * | 12/2000 | Ping et al. | 438/486 |
| 6,161,498 A | 12/2000 | Toraguchi et al. | |
| 6,171,662 B1 | 1/2001 | Nakao | |
| 6,197,669 B1 * | 3/2001 | Twu et al. | 438/585 |
| 6,197,694 B1 | 3/2001 | Beinglass | |
| 6,200,893 B1 | 3/2001 | Sneh | |
| 6,228,181 B1 | 5/2001 | Yamamoto et al. | |
| 6,252,295 B1 | 6/2001 | Cote et al. | |
| 6,271,054 B1 | 8/2001 | Ballantine et al. | |
| 6,294,399 B1 | 9/2001 | Fukumi et al. | |
| 6,326,311 B1 | 12/2001 | Ueda et al. | |
| 6,373,112 B1 | 4/2002 | Murthy et al. | |
| 6,385,020 B1 | 5/2002 | Shin et al. | |
| 6,391,803 B1 | 5/2002 | Kim et al. | |
| 6,413,844 B1 * | 7/2002 | Beulens et al. | 438/565 |
| 6,455,892 B1 | 9/2002 | Okuno et al. | |
| 6,468,924 B2 | 10/2002 | Lee et al. | |
| 6,482,705 B1 | 11/2002 | Yu | |
| 6,503,846 B1 | 1/2003 | Niimi et al. | |
| 6,528,530 B2 | 3/2003 | Zeitlin et al. | |
| 6,537,910 B1 | 3/2003 | Burke et al. | |
| 6,551,893 B1 | 4/2003 | Zheng et al. | |
| 6,566,711 B1 | 5/2003 | Yamazaki et al. | |
| 6,589,868 B2 | 7/2003 | Rossman | |
| 6,613,695 B2 | 9/2003 | Pomarede et al. | |
| 6,638,879 B2 | 10/2003 | Hsich et al. | |
| 6,821,825 B2 | 11/2004 | Todd et al. | |
| 6,824,816 B2 | 11/2004 | Aaltonen et al. | |
| 6,962,859 B2 | 11/2005 | Todd et al. | |
| 7,005,160 B2 * | 2/2006 | Todd et al. | 427/255.28 |
| 7,005,392 B2 | 2/2006 | Baum et al. | |
| 7,125,582 B2 | 10/2006 | McSwiney et al. | |
| 7,172,792 B2 | 2/2007 | Wang et al. | |
| 7,192,626 B2 | 3/2007 | Dussarrat et al. | |
| 2001/0032986 A1 | 10/2001 | Miyasaka | |
| 2002/0047151 A1 | 4/2002 | Kim et al. | |
| 2002/0073925 A1 | 6/2002 | Noble et al. | |
| 2002/0098627 A1 | 7/2002 | Pomarede et al. | |
| 2002/0160605 A1 | 10/2002 | Kanzawa et al. | |
| 2002/0168868 A1 | 11/2002 | Todd | |
| 2002/0174826 A1 | 11/2002 | Maydan et al. | |
| 2002/0174827 A1 | 11/2002 | Samoilov et al. | |
| 2002/0197831 A1 | 12/2002 | Todd et al. | |
| 2003/0022528 A1 | 1/2003 | Todd | |
| 2003/0059535 A1 | 3/2003 | Luo et al. | |
| 2003/0082300 A1 | 5/2003 | Todd et al. | |
| 2003/0111013 A1 * | 6/2003 | Oosterlaken et al. | 118/724 |
| 2004/0096582 A1 | 5/2004 | Wang et al. | |
| 2005/0064684 A1 | 3/2005 | Todd et al. | |
| 2005/0079692 A1 | 4/2005 | Samoilov et al. | |
| 2005/0080286 A1 | 4/2005 | Wang et al. | |
| 2005/0118837 A1 | 6/2005 | Todd et al. | |
| 2005/0250302 A1 | 11/2005 | Todd et al. | |
| 2006/0084283 A1 | 4/2006 | Paranjpe et al. | |
| 2006/0088985 A1 | 4/2006 | Haverkort et al. | |

FOREIGN PATENT DOCUMENTS

| | | |
|---|---|---|
| EP | 0 486 047 A2 | 5/1992 |
| EP | 0 747 974 A2 | 12/1996 |
| EP | 1 065 728 A2 | 1/2001 |
| GB | 2 298 313 A | 8/1996 |
| GB | 2 332 564 A | 6/1999 |
| JP | 57209810 | 12/1982 |
| JP | 59078918 | 5/1984 |
| JP | 59078919 | 5/1984 |
| JP | 60043485 | 3/1985 |
| JP | 61-095535 | 5/1986 |
| JP | 61153277 | 7/1986 |
| JP | 62076612 | 4/1987 |
| JP | 63003414 | 1/1988 |
| JP | 63003463 | 1/1988 |
| JP | 01-179710 | 7/1989 |
| JP | 1217956 A | 8/1989 |
| JP | 1268064 A | 10/1989 |
| JP | 2155225 A | 6/1990 |
| JP | 3091239 A | 4/1991 |
| JP | 3185817 A | 8/1991 |
| JP | 3187215 A | 8/1991 |
| JP | 3292741 A | 12/1991 |
| JP | 4323834 A | 11/1992 |
| JP | 5021378 A | 1/1993 |
| JP | 5062911 A | 3/1993 |
| JP | 7249618 A | 9/1995 |
| JP | 8242006 | 9/1996 |
| JP | 11317530 | 11/1999 |
| JP | 2000-100811 | 4/2000 |
| WO | WO 02/43115 A2 | 5/2002 |
| WO | WO 02/064853 A2 | 8/2002 |
| WO | WO 2004/009861 A2 | 1/2004 |

OTHER PUBLICATIONS

Kanoh et al., "Low-temperature chemical-vapor-deposition of silicon nitride," *Journal de Physique IV*, vol. 2, p. C2-831-C2-837 (1991).

Yeh et al., "Low-temperature chemical-vapor-deposition of silicon-nitride film from hexachloro-disilane and hydrazine," *Jpn. J. Appl. Phys.* vol. 35, Part 1, No. 2B, p. 1509-1512 (Feb. 1996).

Ikoma et al., Growth of Si/3c-SiC/Si(100) hetrostructures by pulsed supersonic free jets, Applied Physics Letters, vol. 75, No. 25, pp. 3977-3979 (Dec. 1999).

International Search Report dated Nov. 13, 2003 for international patent application No. PCTUS02/02921, filed on Feb. 1, 2002.

Iyer et al., "A Process Method of Silicon Nitride Atomic layer Cyclic Deposition," Semicon Taiwan, pp. 17-25 (2001).

Olivares, J. et al.; "Solid-phase crystallization of amorphous SiGe films deposited by LPCVD on SiO2 and glass," Thin Solid Films 337 pp. 51-54 (1999).

Sze, VLSI Technology, "Arrhenius plot for polysilicon deposition for different silane partial pressures," pp. 240-241 (1988).

International Search Report and Written Opinion for International Application No. PCT/US2006/047805. May 8, 2007.

* cited by examiner

LOW TEMPERATURE DOPED SILICON LAYER FORMATION

PRIORITY CLAIM

This application claims the priority benefit under 35 U.S.C. §119(e) of provisional Application No. 60/750,928, filed Dec. 16, 2005, entitled Low Temperature Doped Silicon Layer Formation.

CROSS-REFERENCE TO RELATED APPLICATIONS

In addition, this application is related to: U.S. patent application Ser. No. 11/213,449, filed Aug. 25, 2005; U.S. patent application Ser. No. 10/623,482, filed Jul. 18, 2003; U.S. Pat. No. 6,962,859, issued Nov. 8, 2005; U.S. Pat. No. 6,821,825, issued Nov. 23, 2004; and U.S. patent application Ser. No. 11/370,228, filed Mar. 6, 2006, the disclosure of each of which is hereby incorporated by reference in its entirety.

FIELD OF THE INVENTION

This invention relates generally to semiconductor processing and, more particularly, to methods for forming doped silicon layers.

BACKGROUND OF THE INVENTION

Silicon and doped silicon films are frequently used in the semiconductor devices which form integrated circuits and other electronic devices. Typically, semiconductor devices are formed by depositing the silicon films by chemical vapor deposition (CVD) using silane ($SiH_4$) as the silicon source gas.

For a variety of reasons, including the on-going miniaturization of semiconductor devices, there is a desire for ever thinner and ever smoother films. One method to increase film smoothness is to reduce deposition temperatures. The reduction of deposition temperatures results in the films being deposited in the amorphous state and having a smoother surface than films deposited at relatively high temperatures in the polycrystalline state. However, the deposition rate of the film strongly decreases with temperature and can fall to unacceptably low levels. In particular, the deposition rate can fall so low that the processing becomes uneconomical. Moreover, there exist limits to the extent that smoothness can be increased by lowering the deposition temperature.

This problem is particularly acute in the case of n-type doped films such as phosphorus doped films. A film can be doped as the film is being deposited, thereby forming "as-deposited" doped films. However, n-type dopants are known to poison deposition surfaces, thereby causing a strong reduction in deposition rate when a substrate is exposed to dopant during the deposition of the films. Thus, forming smooth n-type doped films at an acceptable deposition rate is problematic, since the combination of reducing deposition temperatures to deposit smoother films and the poisoning of the deposition surfaces can quickly lead to unacceptably low deposition rates and unacceptably low throughput.

Accordingly, there is a need for methods and apparatus to deposit n-type doped films which are smooth, while allowing for high throughput.

SUMMARY OF THE INVENTION

According to one aspect of the invention, a method of semiconductor processing is provided. The method comprises depositing a silicon layer on a plurality of substrates in a batch process chamber by exposing the substrates to trisilane. The silicon layer is doped by exposing the substrates to an n-type dopant precursor during at least part of the deposition of the silicon layer.

According to another aspect of the invention, a method for forming an integrated circuit is provided. The method comprises doping a silicon layer while depositing the silicon layer in a batch process chamber using trisilane as a silicon precursor. Under the selected deposition conditions, the deposition rate of the silicon layer is substantially independent of a flow rate of the dopant precursor for any dopant precursor flow rate between about 0 sccm and about 160 sccm.

According to another aspect of the invention, a system for processing semiconductor substrates is provided. The system comprises a batch process chamber configured to accommodate a plurality of semiconductor substrates. A source of trisilane and a source of an n-type dopant precursor are in gas communication with the batch process chamber. The system includes a controller programmed to flow the trisilane and the dopant precursor into the process chamber to form as-deposited doped silicon layers on the substrates.

BRIEF DESCRIPTION OF THE DRAWINGS

The invention will be better understood from the detailed description of the preferred embodiments and from the appended drawings, which are meant to illustrate and not to limit the invention and wherein like numerals refer to like parts throughout.

DETAILED DESCRIPTION OF THE PREFERRED EMBODIMENTS

Figure 1:
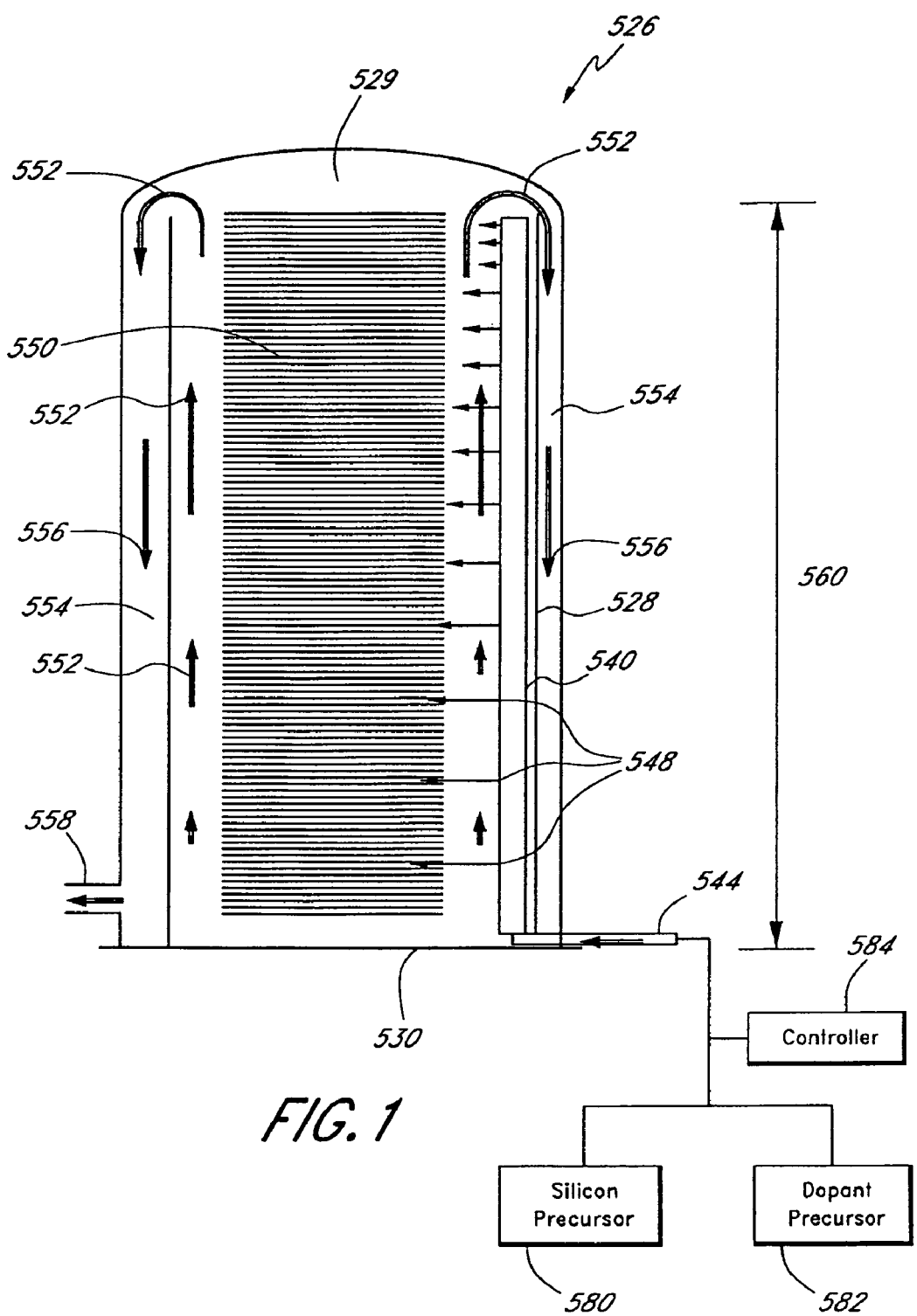
FIG. 1 is a schematic cross-sectional side view of an elongated batch process tube with a gas injector, constructed in accordance with preferred embodiments of the invention.

International patent publication No. WO 04009861 A2, to Todd et al., which claims priority to the above-incorporated U.S. patent application Ser. No. 10/623,482, filed Jul. 16, 2002, discloses a method of depositing silicon to form highly uniform and conformal silicon nitride films. Todd et al. teaches trisilane and nitrogen source pulses that are alternated with intervening purge steps. Todd et al. emphasizes the importance of the mass flow limited regime for such deposition. Todd et al. further discloses that its method can be most advantageously applied to depositions in a single substrate reactor.

It will be appreciated that high quality results in the mass flow limited regime is more easily achieved in the context of single substrate reactors than in batch systems. Batch systems, while advantageously allowing for increased throughput by simultaneously processing a plurality of substrates, can encounter difficulties in achieving an even distribution of precursor vapors across all substrates within the reaction chamber. Because the local deposition rate in a mass flow limited regime is dependent upon the local concentration of precursor, an uneven distribution of precursors can result in an uneven deposition rate across a substrate or across a batch of substrates. In turn, the uneven deposition rate can result in layers with uneven thicknesses. On the other hand, batch systems can often employ principles of hot wall reactors to achieve highly uniform temperature distributions. Accordingly, rather than the mass transport limited regime, depositions according to the preferred embodiments are preferably conducted under reaction rate limited conditions, also known as the kinetically limited reaction regime or kinetic regime, wherein deposition rates are sensitive to temperature changes but relatively insensitive to supplied reactant concentrations.

Depositions according to the preferred embodiments allow for the formation of very smooth n-type doped silicon layers in a batch reactor. Preferably, a silicon precursor and an n-type dopant precursor are used to form the doped silicon layer. The silicon precursor is preferably tri-silane. To form n-type doped silicon films, the other precursor is preferably an n-type dopant precursor, such as $AsH_3$ and, more preferably, phosphine ($PH_3$). Deposition conditions are preferably chosen such that the formation of the doped silicon layer occurs in the kinetic regime.

The silicon precursor can be flowed into a batch process chamber simultaneously or at different times than the dopant precursor. For example, the flow of the silicon precursor and the dopant precursor into the process chamber can be established simultaneously. In some embodiments, the silicon precursor is first flowed into the process chamber and a flow of the dopant precursor is subsequently added to the silicon precursor flow. In other embodiments, the silicon precursor and the dopant precursor can be flowed into the process chamber at completely different times. In yet other embodiments, the dopant precursor is constantly flowed into the process chamber, while the silicon precursor is flowed into the process chamber in temporally separated pulses.

Thus, depositions according to the preferred embodiments advantageously allow for the formation of very uniform, smooth and conformal films with good throughput, as discussed further below.

Reference will now be made to the Figures, wherein like numerals refer to like parts throughout.

Preferred Batch Reactor

Figure 2:
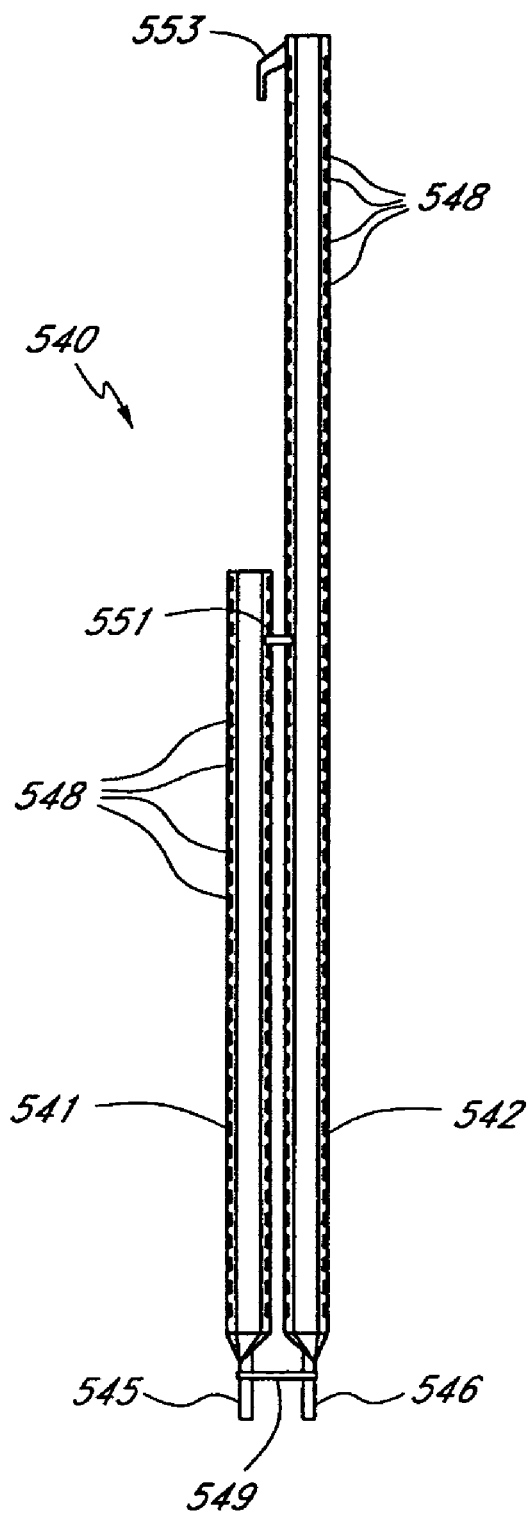
FIG. 2 is a front view of a gas injector for use with the batch process tube of FIG. 1.
Figure 3:
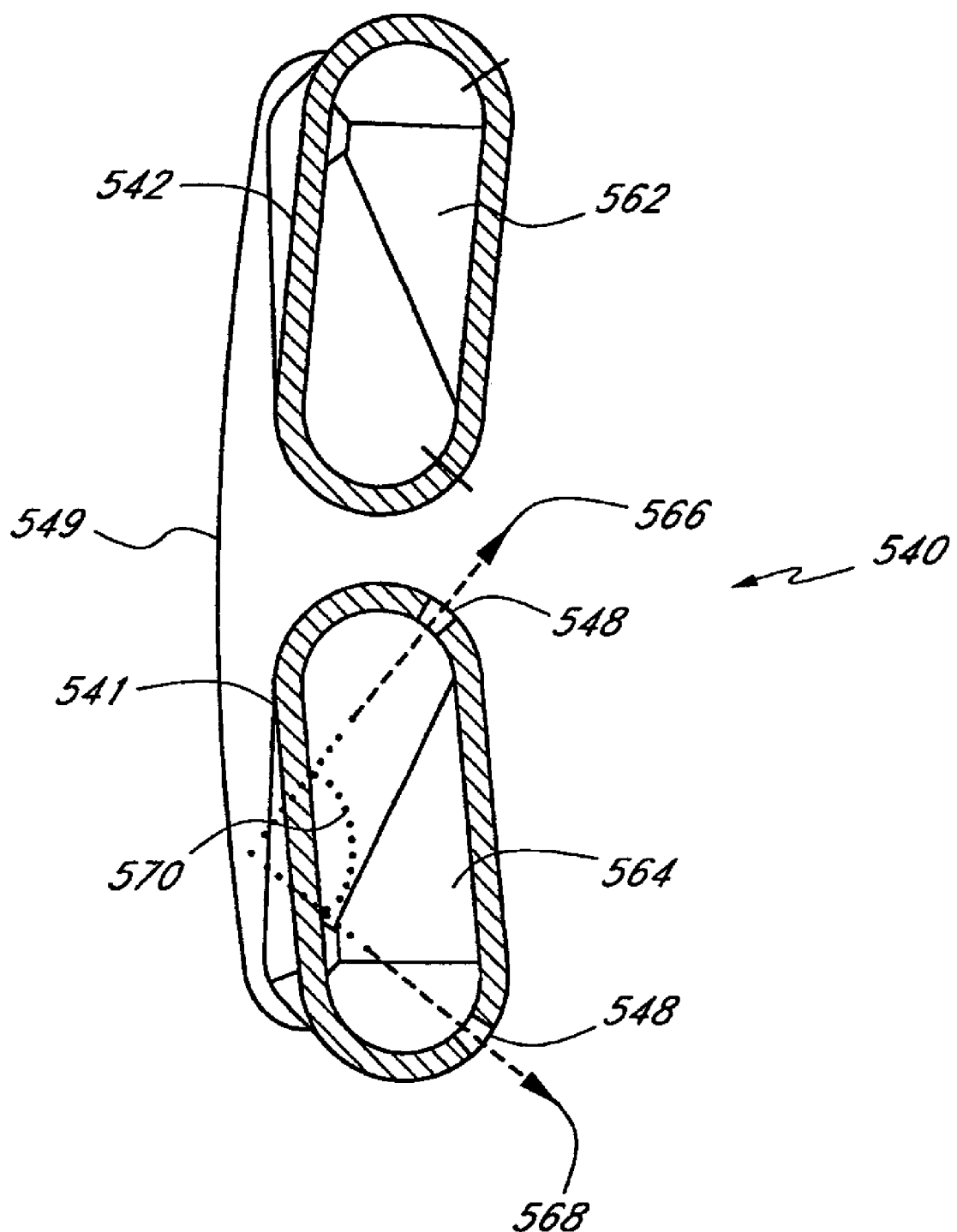
FIG. 3 is a horizontal cross-sectional view of the gas injector of FIG. 2.

FIGS. 1-3 illustrate different versions of an exemplary hot wall batch reactor, commercially available under the trade name Advance 412™ or A412™ from ASM International N.V. of Bilthoven, The Netherlands. The illustrated reactor is a vertical furnace type of reactor, which has benefits for efficient heating and loading sequences, but the skilled artisan will appreciate that the principles and advantages disclosed herein will have application to other types of reactors.

With reference to FIG. 1, a schematic cross-sectional side-view is shown of an exemplary elongated furnace with a gas injector. The process tube or chamber 526 is preferably surrounded by a heating element (not shown). A liner 528, delimiting the outer perimeter of the reaction space 529, is preferably provided inside the process chamber 526. Preferably, at the bottom of the process chamber 526, a wafer load 550 may enter and exit the process chamber 526 by a door 530. Precursor source gas is injected through a vertically elongated gas injector 540, preferably via a gas feed conduit 544. The gas injector 540 is provided with a pattern of holes 548, preferably extending substantially over the height of the wafer load 550. Note that, because gases are first introduced into the reaction space 529 from the holes 548 of the gas injector 540, the interior of gas delivery devices, such as the gas injector 540, through which gases travel is not part of the reaction space 529 and is, in a sense, outside of the reaction space 529. Consequently, the reaction space 529 comprises the interior volume of the process chamber 526, excluding the volume occupied by gas delivery devices such as the gas injector 540.

In a preferred embodiment, inside the process chamber 526, gas is flowed in a generally upward direction 552 and then removed from the reaction space 529 via an exhaust space 554 between the process chamber 526 and the liner 528, where gas flows in a downward direction 556 to the exhaust 558, which is connected to a pump (not shown). The gas injector 540 preferably distributes process gases inside the process chamber 526 over the entire height of the reaction space 529. The gas injector 540 itself acts as a restriction on the flow of gas, such that the holes 548 that are closer to the conduit 544 tend to inject more gas into the reaction space than those holes 548 that are farther from the conduit 544. Preferably, this tendency for differences in gas flows through the holes 548 can be compensated to an extent by reducing the distance between the holes 548 (i.e., increasing the density of the holes 548) as they are located farther away from the conduit 544. In other embodiments, the size of individual holes making up the holes 548 can increase with increasing distance from the conduit 544, or both the size of the holes 548 can increase and also the distance between the holes 548 can decrease with increasing distance from the conduit 544. Advantageously, however, the preferred embodiments are illustrated with holes 548 of constant size so as to minimize the surface area of the sides of the gas injector 540 containing the holes 548.

The injector 540 is advantageously designed to reduce the pressure inside the gas injector, resulting in a reduction of the gas phase reactions within the injector, since reaction rates typically increase with increasing pressure. While such reduced pressure can also lead to a poor distribution of gas over the height of the gas injector 540, the distribution of holes 548 across the height of the injector 540 is selected to improve uniformity of gas distribution.

The gas injector 540 can be connected to a source 580 of a silicon precursor, preferably trisilane, and a source 582 of a dopant precursor. A controller 584 is connected to the gas supply system and is programmed to control the reactor, including the flow of the silicon precursor and the dopant precursor into the process chamber 526 and other deposition conditions (e.g., process chamber temperature, pressure, etc.). While shown for ease of illustration with the silicon and dopant precursor sources 580 and 582 connected to a single gas injector 540, each source 580 and 582 can be connected to different gas injectors in other embodiments.

The gas injector 540 in accordance with one illustrative embodiment of the invention is shown in FIG. 2. The gas injector 540 preferably comprises two gas injector parts 541 and 542, each preferably provided with separate gas feed conduit connections 545 and 546, respectively. Each gas feed conduit connection is connected to a gas feed in communication with a source of a silicon precursor, preferably tri-silane, and a source of n-type dopant precursor, preferably phosphine, $PH_3$. Each of the source gases can be mixed with a diluent gas such as, without limitation, nitrogen, hydrogen, helium or argon. The first injector part 541 injects gas into the lower volume of the reaction space 529 (FIG. 1) and the second injector part 542 injects gas into the upper volume of the reaction space 529 (FIG. 1). The parts 541 and 542 are connected by linkages 549 and 551. At its top end, the gas injector 540 can be provided with a hook 553, to secure the top end of the gas injector 540 to a hook support inside the chamber 526 (FIG. 1).

The gas injector 540 is provided with a pattern of holes 548 substantially extending over the height 560 (FIG. 1) of the wafer load 550 (FIG. 1). The total cross section of the holes is preferably at least about 30 mm$^2$. The diameter of each of holes 548 is preferably about 1 mm or more, more preferably between about 2.5 mm and 3.5 mm, and most preferably about 3 mm. In the illustrative embodiment shown in FIG. 2, the gas injector 540 has 40 holes total for a total hole cross-sectional area of about 282 mm$^2$. More generally, the total cross-sectional area of the holes 548 is preferably about 30 mm$^2$ or more, and more preferably between about 196 mm$^2$ and 385 mm$^2$.

With reference to FIG. 3, each part 541 and 542 of the gas injector 540 has an inner cross-sectional area 564 and 562, respectively, available for the conduction of source gases through the gas injector 540. Preferably, each of inner cross-sectional areas 564 and 562 are at least about 100 mm$^2$. In the illustrative embodiment, the cross-sectional area of each of the parts 541, 542 of the gas injector 540 is about 330 mm$^2$. More generally, the cross-sectional area of each of the parts 541, 542 is between about 140 mm$^2$ and 600 mm$^2$, more preferably between about 225 mm$^2$ and 455 mm$^2$.

The cross-section shown in FIG. 3 is taken through the lower end of the gas injector 540 and straight through a pair of injection holes 548 provided in gas injector part 541 for injecting the gas into the lower end of the process chamber 526. Preferably, in each gas injector part, the holes 548 are provided in pairs, at the same height. In addition, the two holes 548 preferably inject the precursor gases in two directions 566 and 568 forming an angle 570 of between about 60 and 120 degrees, illustrated at about 90 degrees, to improve the radial uniformity of the gas distribution. Moreover, as shown, the tubes comprising the gas injector 540 preferably have an oblong shape, as viewed in horizontal cross-section. Preferably, the longer dimension of the oblong shape faces the center of the process chamber 526, i.e., the side of the oblong shape with the longer dimension is perpendicular to an imaginary line extending radially from the center of the process chamber 526.

In a preferred embodiment, in a CVD mode, two precursor source gases, providing elements of an n-type doped silicon film, are mixed in a gas supply system (not shown) prior to entering the gas injector 540 via feed conduit connections 545 and 546 (FIG. 2). Pre-mixing the precursor gases in the gas supply system is one way to ensure a homogeneous composition of injected gas over the height of the boat. However, the gases can be flowed into the process chamber 526 (FIG. 1) without pre-mixing (see discussion of FIGS. 4-7 below). In another embodiment, the two precursor source gases can each be injected via their own separate gas injectors 540 (not shown), so that they are first mixed, if at all, after being injected into the reaction space 529. In addition, multiple gas injectors 540 can be provided to deliver pre-mixed precursor gases into the process chamber 526. Consequently, it will be appreciated that more than one gas injector 540 may be located inside the process chamber 526.

Advantageously, the use of two gas injector parts 541 and 542 allows for further tuning possibilities. The flows supplied to the different gas injector parts 541, 542 can be chosen differently to fine-tune the gas flow into the reaction space 529. This will improve uniformity in the deposition rates of precursors over the height 560 of the wafer load 550 (FIG. 1).

Preferred Silicon and n-type Dopant Precursors

The use of trisilane ($H_3SiSiH_2SiH_3$ or $Si_3H_8$) as a silicon precursor in combination with an n-type dopant, preferably a dopant hydride such as phosphine, offers substantial benefits when forming as-deposited silicon layers, also referred to herein as in situ doped silicon layers. Use of n-type dopants for depositing in situ doped silicon layers has been discouraged due to possible poisoning of the substrate surface, which can interfere with nucleation of silicon species on the substrate and cause poor deposition rates and deposited film properties. Advantageously, it has been found that deposition using trisilane and phosphine can form an in situ doped film having high smoothness and high deposition rates.

Advantageously, formation of an in situ doped silicon film with trisilane and phosphine can be performed at substantially lower temperatures than with other silicon precursors, such as silane ($SiH_4$), thereby facilitating the deposition of a smooth film. Moreover, phosphine has been observed to not appreciably interfere with the nucleation of trisilane, thereby allowing for a relatively short film nucleation time, which reduces the size of localized deposits of silicon. As a result, deposited silicon films can be made thinner, while still being uniform. Moreover, the films will show reduced surface roughness due to the reduced size of the localized silicon deposits.

In addition, with regards to process throughput, use of trisilane and phosphine allows higher deposition rates of high quality films relative to processes using silane and phosphine. Use of trisilane and phosphine also reduces thermal budgets, since it allows use of lower process temperatures than does silane.

Thus, employing trisilane and phosphine in the deposition methods described herein provides numerous advantages. For example, these deposition methods enable the production of doped silicon films that are uniformly thin and continuous. These advantages, in turn, enable devices to be produced in higher yields, and also enable the production of new devices having smaller circuit dimensions and/or higher reliability. These and other advantages are discussed below.

In some embodiments, an arsenic containing precursor, most preferably $AsH_3$, can be used as an n-type dopant with many of the advantages discussed above.

Preferred Process Flows

In forming the silicon layer, deposition from a silicon precursor can be conducted according to various deposition methods known to those skilled in the art, but the greatest benefits are obtained when deposition is conducted according to the CVD methods taught herein. The disclosed methods can be practiced by employing CVD, including plasma-enhanced chemical vapor deposition (PECVD) or, more preferably, thermal CVD.

Deposition conditions are preferably tailored to processing in the particular type of reactor in which substrates are loaded. In general, deposition conditions are established to supply sufficient energy to pyrolize or decompose the silicon precursor on a hot substrate surface.

In addition, deposition conditions are preferably established so that the reaction rate of the silicon precursor is the limiting variable for the silicon deposition rate. Thus, the ability of hot wall reactors to achieve highly uniform temperature distributions can advantageously be applied to form uniform layers. While depositions conducted under reaction kinetics limited conditions have deposition rates that are sensitive to temperature changes, the ability to establish high temperature uniformity minimizes the effect of this sensitivity. Moreover, reaction kinetics limited conditions advantageously have deposition rates that are relatively insensitive to supplied reactant concentrations.

It will be appreciated that a reaction kinetics limited regime is preferably primarily achieved by use of a relatively low temperature. This results in a reduced film deposition rate. Because of the large batch size, an adequate throughput can still be achieved at a deposition rate that results from temperatures shifted down into the reaction rate limited regime. Advantageously, trisilane in combination with the n-type dopant precursor enables acceptable deposition rates at very low temperatures, allowing a considerably reduced consumption of thermal budgets. As the skilled artisan will readily appreciate, thermal budgets are constantly reduced as critical dimensions are scaled down, tolerances for diffusion are reduced, and new materials with lower resistance to thermal processing are introduced. The process is preferably operated at a temperature below about 600° C. and, more preferably, at a temperature below about 500° C., and, even more preferably, at a temperature between about 300° C. and about 500° C.

In addition to temperature, the skilled artisan will appreciate that the kinetic regime is partially dependent upon the reactant supply or partial pressure of the silicon precursor. Preferably, the reaction rate is slower than the rate at which reactant is supplied.

Various preferred deposition sequences will now be described with reference to FIGS. 4-7. It will be appreciated that these figures are not necessarily drawn to scale. Thus, while a gas flow or the lack of a gas flow is indicated by the figures, the relative heights of lines on the graphs, or the spacing between pulses (e.g., FIG. 6) are not indicate of any particular flow rate or temporal spacing between pulses. While the flow rates and the spacing between pulses are preferably uniform during a deposition, they may also vary, if desired.

Figure 4:
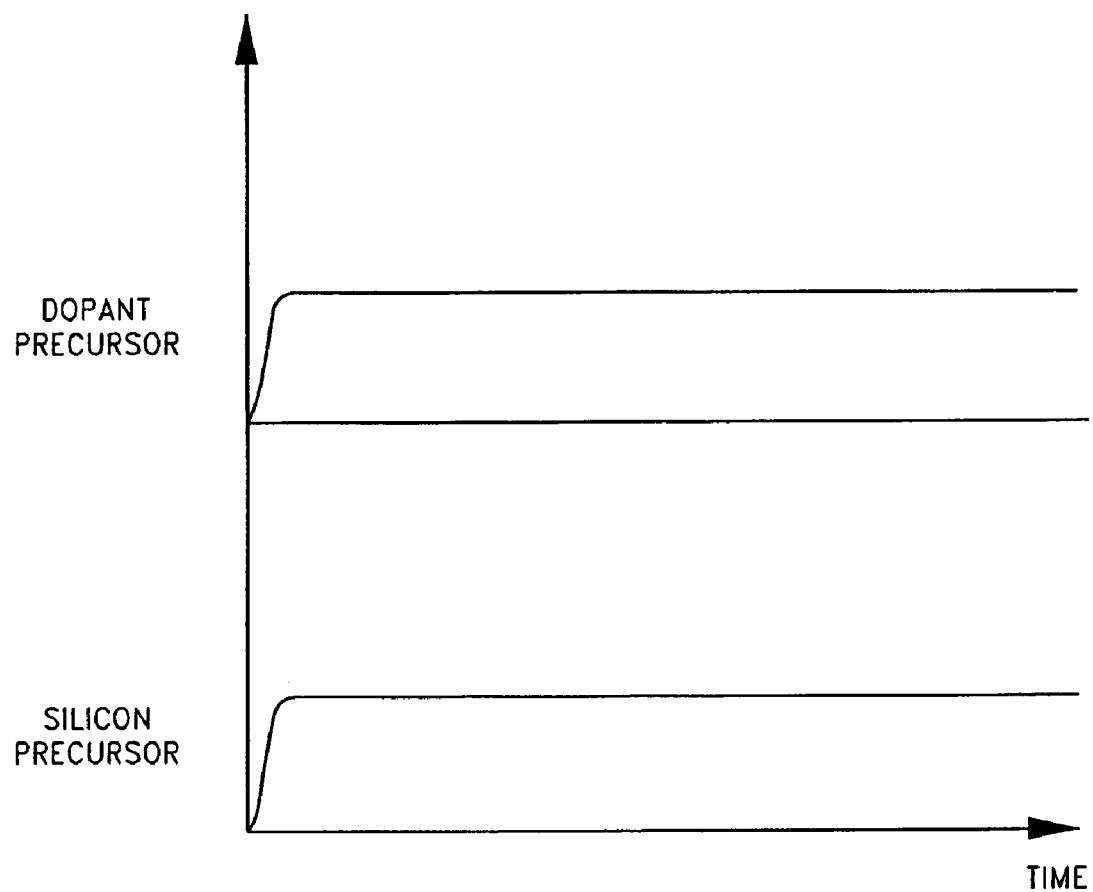
FIG. 4 is a gas flow diagram for forming a doped silicon layer, according to preferred embodiments of the invention.

With reference to FIG. 4, the flow of the silicon precursor and the dopant precursor into the process chamber can be established and maintained simultaneously. The dopant precursor is admitted into the process chamber from the beginning of the deposition, together with the silicon precursor, thereby forming an in situ doped silicon film.

It will be appreciated that use of such a sequence has been discouraged, since the nucleation and the deposition rate of the silicon film is expected to be adversely affected by contact of the substrate with the dopant precursor. Advantageously, however, it has been found that deposition using trisilane as the silicon precursor and using phosphine as the dopant precursor results in exceptionally uniform films with good throughput, such that relatively high deposition rates and exceptional smoothness can be achieved for in situ n-doped films, thereby obviating separate doping steps.

Figure 5:
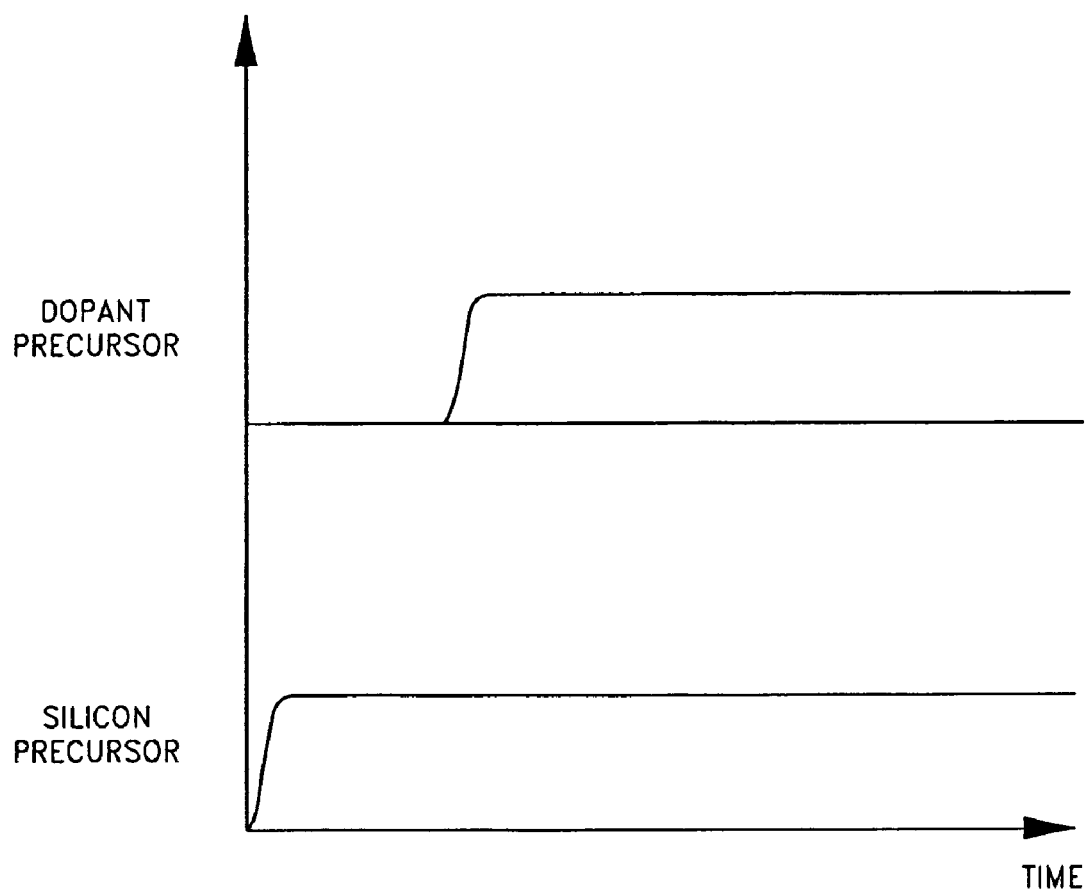
FIG. 5 is a gas flow diagram for forming a doped silicon layer, according to other preferred embodiments of the invention.

With reference to FIG. 5, the flow of the silicon precursor into the process chamber is first established, and a flow of the dopant precursor is later established, while the silicon precursor continues to flow into the process chamber. Trisilane is first flowed into the process chamber during an initial film deposition period for nucleation and deposition of a thin undoped silicon film. This film is grown by flowing a mixture of the dopant precursor and the silicon precursor into the process chamber to form a phosphorus doped silicon film. The doping level and growth rate can be optimized by varying of the total pressure and ratio of the dopant precursor to the silicon precursor. As noted above, exposing a substrate to the n-type dopant precursor can poison the deposition surface and adversely influence the deposition rate. Advantageously, ramping up the trisilane flow before the dopant precursor flow can minimize this poisoning at the sensitive nucleation stage of deposition by preventing exposure of the underlying substrate to the dopant precursor.

Figure 6:
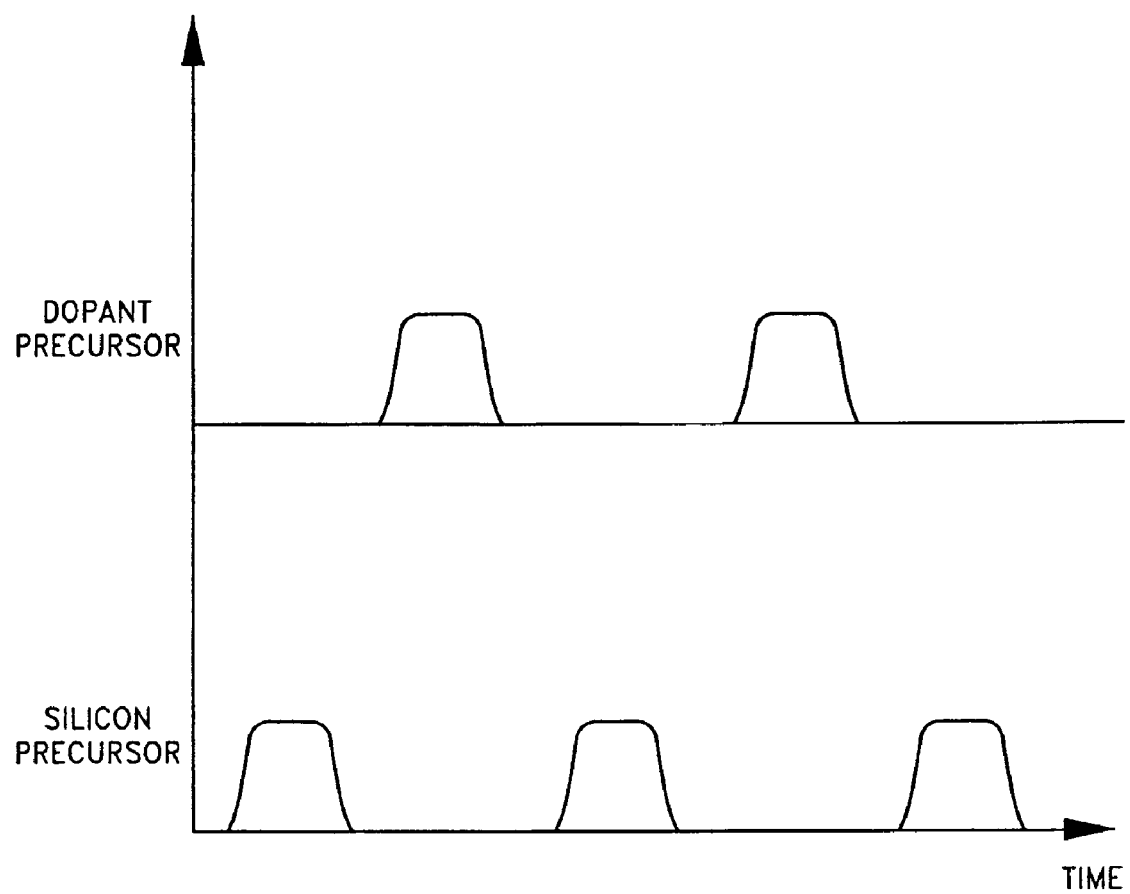
FIG. 6 is a gas flow diagram for forming a doped silicon layer, according to yet other preferred embodiments of the invention.

With reference to FIG. 6, the silicon precursor and the dopant precursor can be sequentially and repeatedly flowed into the process chamber. In the illustrated embodiment, the silicon precursor is first flowed into the process chamber during an initial film deposition period for nucleation and deposition of a very thin undoped silicon film. The flow of the silicon precursor is then interrupted to introduce a flow of the dopant precursor into the process chamber. The flow of the dopant precursor is next interrupted and the sequence of alternatingly flowing the silicon precursor and the dopant precursor is repeated until the doped film reaches a desired total film thickness. The process chamber can be purged between the introductions of the precursors into it. Preferably, the films are deposited by pyrolyzing or decomposing the silicon precursor to deposit a silicon film with a thickness of about 5 Å to about 10 Å per cycle. At such thickness, the applied anneal for doping activation is preferably about 800° C. for about 10 minutes, which results in limited redistribution of the phosphorus under these conditions.

Figure 7:
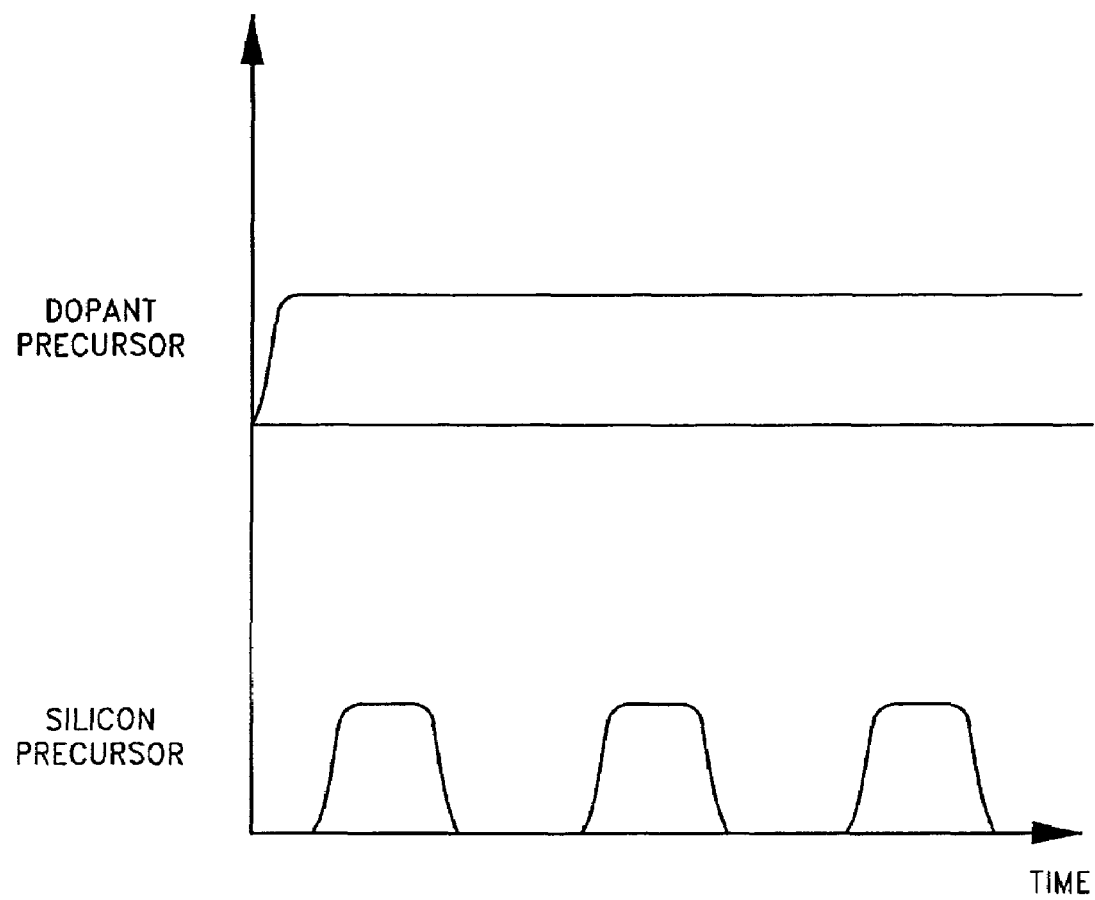
FIG. 7 is a gas flow diagram for forming a doped silicon layer, according to further preferred embodiments of the invention.

With reference to FIG. 7, the dopant precursor is continuously flowed into the process chamber, while the silicon precursor is provided to the process chamber in temporally spaced pulses. This sequence can advantageously be applied if a process utilizing a mixture of the silicon precursor and the dopant precursor or a process with alternating flows of the silicon precursor and the dopant precursor (see FIGS. 4-6) do not result in a sufficiently high dopant concentration. Optionally, the sequence can start by flowing the silicon precursor only to provide a nucleation layer and to minimize exposure of the substrate to the dopant precursor.

For the various sequences above, exemplary process conditions include a process chamber pressure of about 100-600 mTorr, and a process chamber temperature of about 430-500° C. A silicon precursor flow of about 20-100 sccm is mixed with a carrier gas flow, e.g., a $N_2$ flow, of between about 100 sccm to about 1 slm before entry into the process chamber. Another carrier gas flow of about 20-100 sccm and comprising 1% dopant precursor can be used to deliver the dopant precursor into the process chamber.

Before proceeding with a deposition, a pre-coating process can be performed to pre-coat the process chamber walls and substrate holder. It will be appreciated that the pre-coat can act as a heat shield and can smoothen the surfaces of the process chamber and substrate holder, thereby advantageously allowing for a more uniform temperature distribution in the process chamber and increasing deposition rates by decreasing the surface area of exposed surfaces. The pre-coat can be, e.g., a film of silicon deposited to a thickness of, e.g., 500 Å.

Film Properties

Despite the expected poor results from in situ n-doping, the processes described herein achieve exceptional smoothness for in situ n-type doped silicon.

Suitable methods for measuring film thickness include multiple-point ellipsometric methods. Instruments for measuring film thickness are well known and commercially available. Preferred instruments include the Nanospec® series of instruments from Nanometrics, Inc., Sunnyvale, Calif. The thickness of a doped silicon film can also be determined by cross-sectioning the substrate and measuring the thickness by an appropriate microscopy technique, most preferably by electron microscopy. The span over which a thickness is measured can be any span in the range of from about 10 times the thickness of the film to the entire span of the doped silicon film. If the film thickness varies over the span, then the thickness is considered to be the average thickness, i.e., the numerical average of the thickest and thinnest dimensions of the film over a given span. Preferably, the 1σ-uniformity of the film thickness is about 1% or less.

As used herein, rms (more properly, the square root of the mean squared error) is a way of expressing the amount of variability exhibited by the members of a given population. For example, in a group of objects having an average weight of y grams, each member of the group has a weight y' that differs from the average by some amount, expressed as (y'−y). To calculate rms, these differences are squared (to ensure that they are positive numbers), summed together, and averaged to yield a mean squared error. The square root of the mean squared error is the rms variability.

In addition to thickness uniformity, preferred doped silicon films preferably provide a conformal coating over varied topography. A conformal coating is a layer that follows the curvature, if any, of the structure that it overlies. The conformal doped silicon films preferably exhibit good step coverage. "Step coverage" refers to the thickness uniformity of a conformal film that overlies a stepped surface. A stepped surface is a surface that has two or more parallel components that are not disposed in the same horizontal plane. Step coverage is preferably determined by measuring the average thickness of the film at the bottom of the step, dividing it by the average thickness at the top of the step, and multiplying by 100 to express the result in percentage terms.

The preferred doped silicon films have good step coverage even at relatively high aspect ratios. "Aspect ratio" refers to the ratio of the vertical height of the step to the horizontal width of the structure. At an aspect ratio in the range of about 4.5 to about 6, preferred doped silicon films have a step coverage of about 70% or greater, more preferably 80% or greater. At an aspect ratio in the range of about 1 to about 4, preferred doped silicon films have a step coverage of about 80% or greater, more preferably 90% or greater. Step coverage is preferably calculated as stated above, but can also be calculated by taking into account sidewall thicknesses. For example, alternate definitions of step coverage involve the ratio of the sidewall thickness to the average thickness at the top and/or bottom of the step. However, unless otherwise stated, step coverage herein is determined as stated above by measuring the average thickness of the horizontal portions of the doped silicon film at the bottom of the step, dividing it by the average thickness of the horizontal portions at the top of the step, and multiplying by 100 to express the result in percentages.

Advantageously, surface smoothness and thickness of the preferred doped silicon films are maintained over a surface area of about one square micron ($\mu m^2$) or greater, more preferably about 5 $\mu m^2$ or greater, even more preferably about 10 $\mu m^2$ or greater. The doped silicon film can cover all or part of a large substrate, e.g., a wafer, and thus can have a surface area of about 300 $cm^2$ or greater, preferably about 700 $cm^2$ or greater.

Along with good step coverage, in many cases the surface roughness of the doped silicon film is substantially the same as the roughness of the surface that it overlies. Surface roughness is preferably rms surface roughness as measured by atomic force microscopy (AFM) on a 1 micron×1 micron portion of the surface in question. The roughness of the underlying substrate surface can range from about 1 Å rms (atomically flat surface) up to about 25 Å rms or even higher. Preferably, the underlying substrate surface has a roughness of 10 Å rms or less, more preferably 5 Å rms or less, so that the overlying doped silicon film has a comparable roughness. For an underlying substrate surface having a given degree of roughness, the doped silicon film deposited thereon preferably has a surface roughness that is greater than the substrate surface roughness by an amount of about 5 Å or less, more preferably about 3 Å or less, even more preferably about 2 Å or less. For example, if the substrate surface roughness is about 7 Å rms, then the measured surface roughness of the doped silicon film deposited thereon is preferably about 12 Å rms (7 Å+5 Å) or less. Preferably, the underlying surface has a roughness of about 2 Å rms or less and the overlying doped silicon film has a measured surface roughness of about 5 Å rms or less, more preferably about 3 Å rms or less, most preferably about 2 Å rms or less.

The doping level of the silicon layer is preferably about $4.00×10^{20}$ atoms/$cm^3$ or more and, more preferably, about $5.00×10^{20}$ atoms/$cm^3$. The 1σ-uniformity of the doping level is preferably about 1% or less.

The level of particles added to the deposited layer is preferably also low. Preferably, less than 20 particles having a size of about 0.12 $\mu m$ or greater are added per substrate. More preferably, less than 10 particles having a size of about 0.12 $\mu m$ or greater are added per substrate.

Exemplary Results

Deposition according to the preferred embodiments provides numerous advantages. Some of these advantages are discussed below with reference to FIGS. 8-12, which show exemplary results achieved in various deposition processes.

Figure 8:
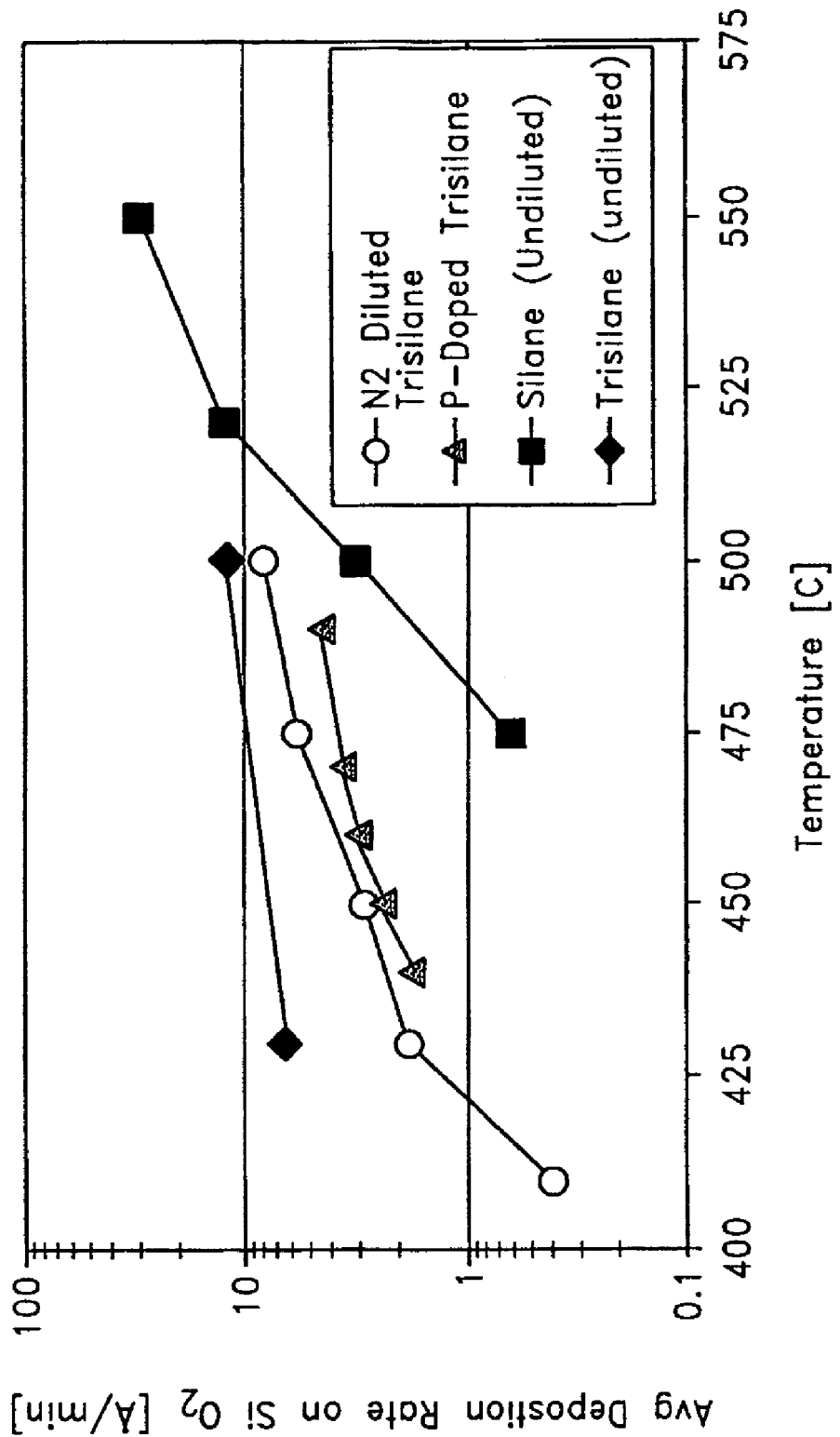
FIG. 8 shows a comparison of deposition rate as a function of temperature for depositions using silane or trisilane as the silicon precursor.

FIG. 8 shows a comparison of deposition rates achieved using silane and trisilane as silicon precursors to deposit silicon films at various temperatures. Notably, for a deposition temperature of 475° C., the deposition rate using silane was below 1 Å/min. The skilled artisan will appreciate that this deposition rate is generally unsuitable for integrated circuit fabrication.

In contrast, trisilane offers a higher deposition rate, which also varies less as a function of temperature than for depositions using silane. Using trisilane, good deposition rates were achieved down to process temperatures of 430° C. The trisilane used for the illustrated results was semiconductor grade trisilane, which is produced and sold by Voltaix Inc, Branchburg, N.J., U.S.A. under the trademark Silcore® licensed from ASM America, Inc. of Phoenix, Ariz. With continued reference to FIG. 8, it can also be seen that adding phosphine ($PH_3$) to the trisilane flow to form phosphorus-doped films had a minimal impact on the deposition rate of the film. Advantageously, while PH$_3$ would be expected to significantly decrease the deposition rate when used in combination with silane, the deposition rate using PH$_3$ and trisilane was in fact still higher than that using silane alone. In addition, the deposition rate using trisilane is advantageously greater than 1 Å/min for temperatures from about 430° C. to about 500° C.

Figure 9:
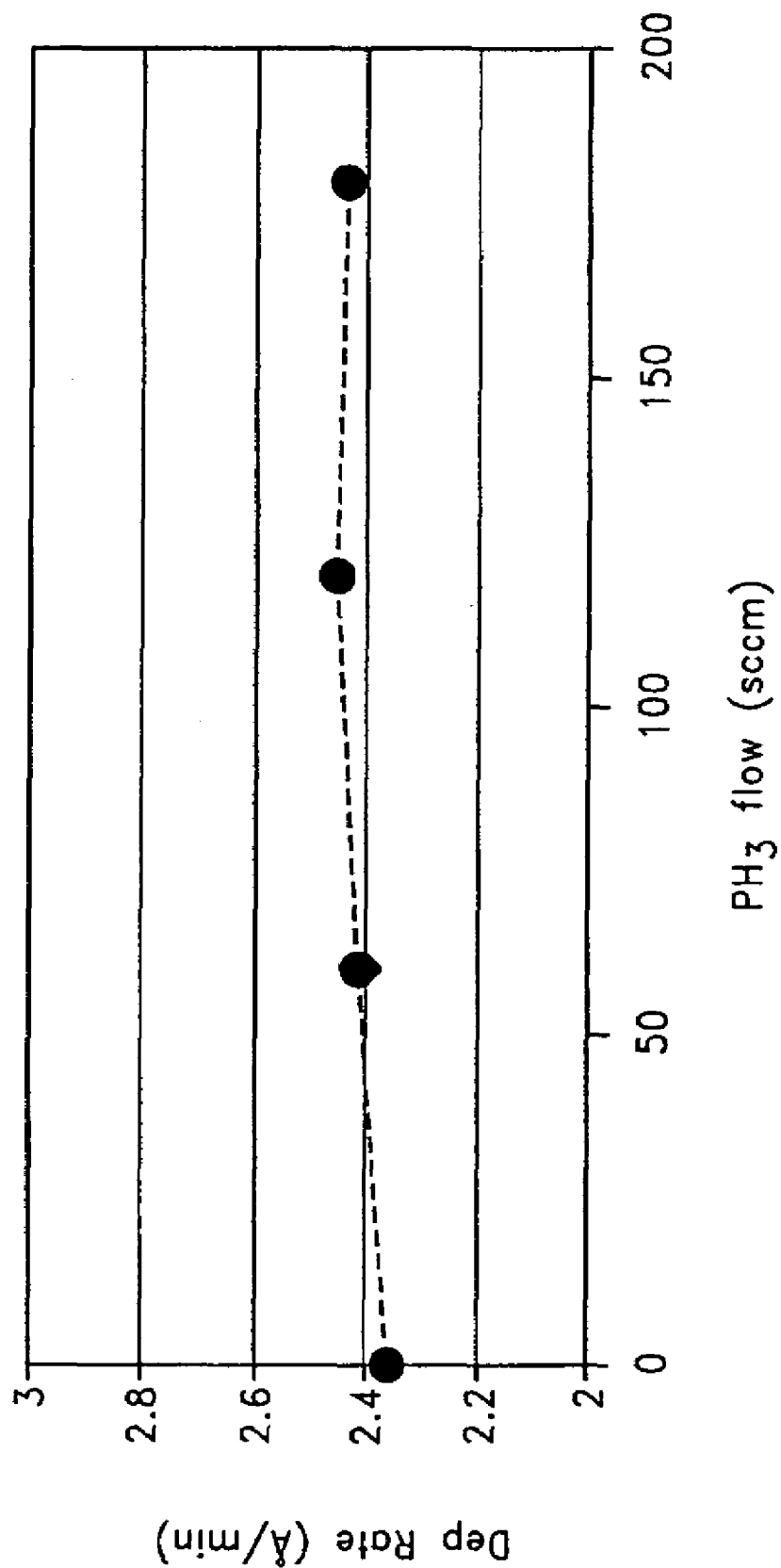
FIG. 9 shows deposition rate as a function of $PH_3$ flow for a process for forming an as-deposited phosphorus-doped silicon film, in accordance with preferred embodiments of the invention.

FIG. 9 shows the deposition rate of an as-deposited phosphorus-doped silicon film as a function of PH$_3$ flow. The deposition was performed using trisilane at a deposition temperature of 450° C. FIG. 9 demonstrates in further detail that, surprisingly, the deposition rate of the silicon film using trisilane as a precursor is substantially independent of the flow rate, or partial pressure, of PH$_3$ (in N$_2$ carrier gas having 1% PH$_3$) in the process chamber. As can be seen in FIG. 9, the deposition rate varies minimally as the flow rate of PH$_3$ was varied between about 0 sccm and about 175 sccm. The skilled artisan will note that this is a significant advantage and a significant difference with silane; using silane as a silicon source gas would result in a dramatic reduction in deposition rate as a function of increasing PH$_3$ flow.

Figure 10:
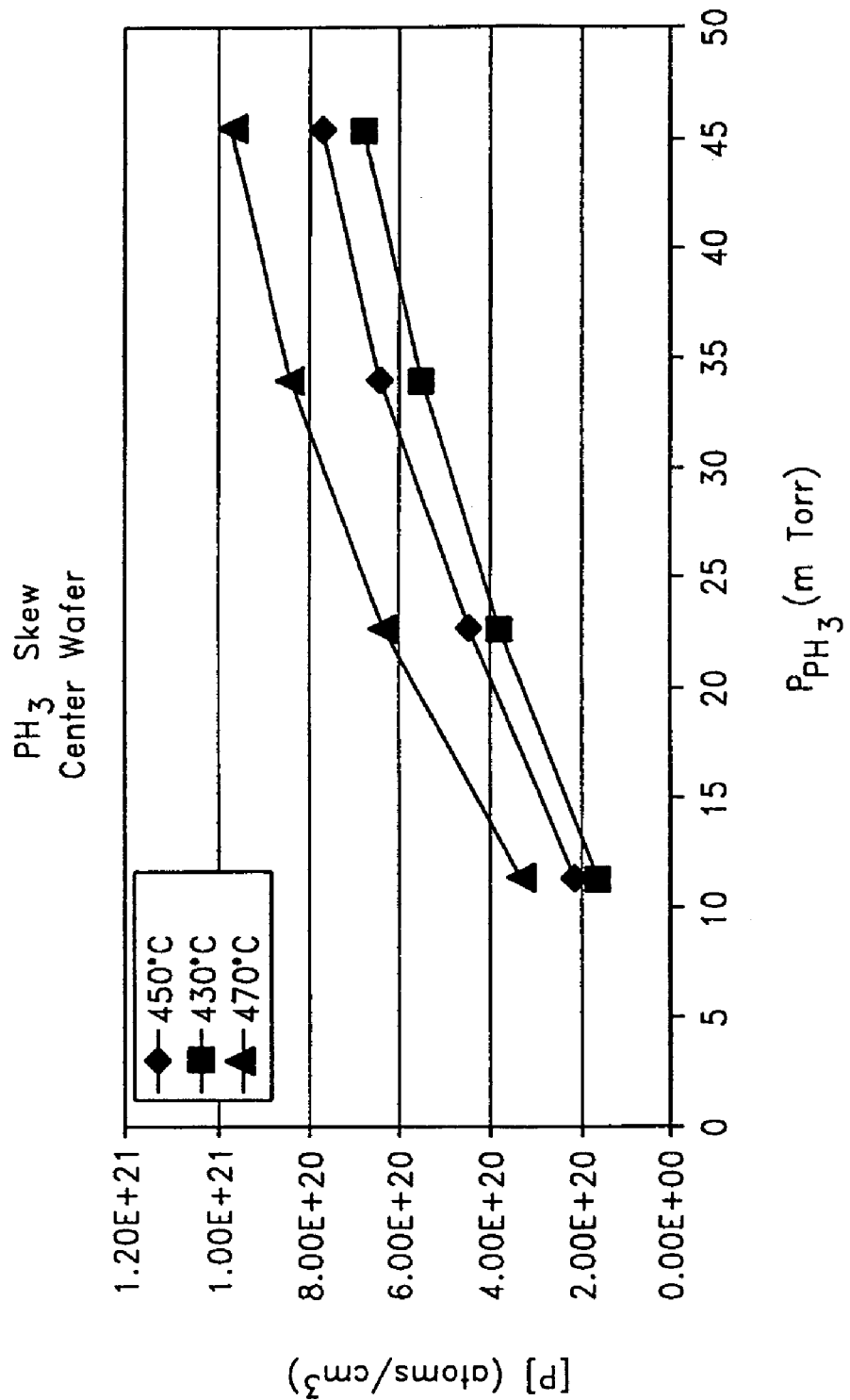
FIG. 10 shows phosphorus incorporation as a function of $PH_3$ partial pressure for a process for forming an as-deposited phosphorus-doped silicon film, in accordance with preferred embodiments of the invention.

FIG. 10 shows the phosphorus incorporation of an as-deposited phosphorus-doped silicon film as a function of PH$_3$ partial flow. Trisilane was used as the silicon precursor and the depositions were performed at temperatures of 430° C., 450° C. and 470° C. The phosphorus source was 1% PH$_3$ in a N$_2$ carrier gas. The partial pressure was calculated as the flow of the 1% PH$_3$ in N$_2$ divided by the total gas flow, times the total pressure. Advantageously, a nearly linear increase in phosphorus incorporation as a function of PH$_3$ partial pressure was found. Together with the deposition rate independence from PH$_3$ partial pressure (FIG. 9), it can be seen that the combination of trisilane and dopant hydride present unexpected benefits.

Figure 11:
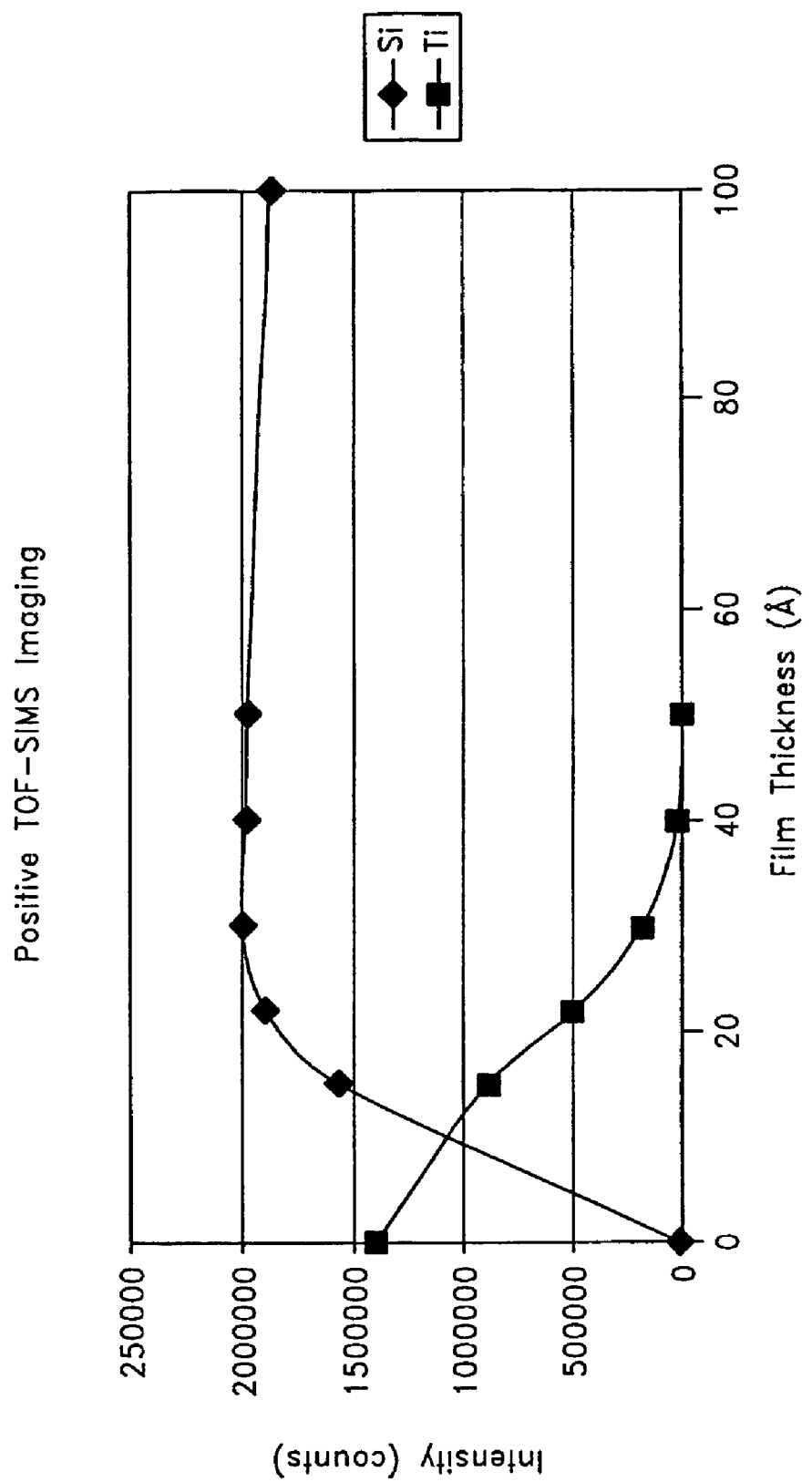
FIG. 11 shows titanium concentration as measured with TOF SIMS for different thicknesses of silicon films deposited over a TiN film.
Figure 12:
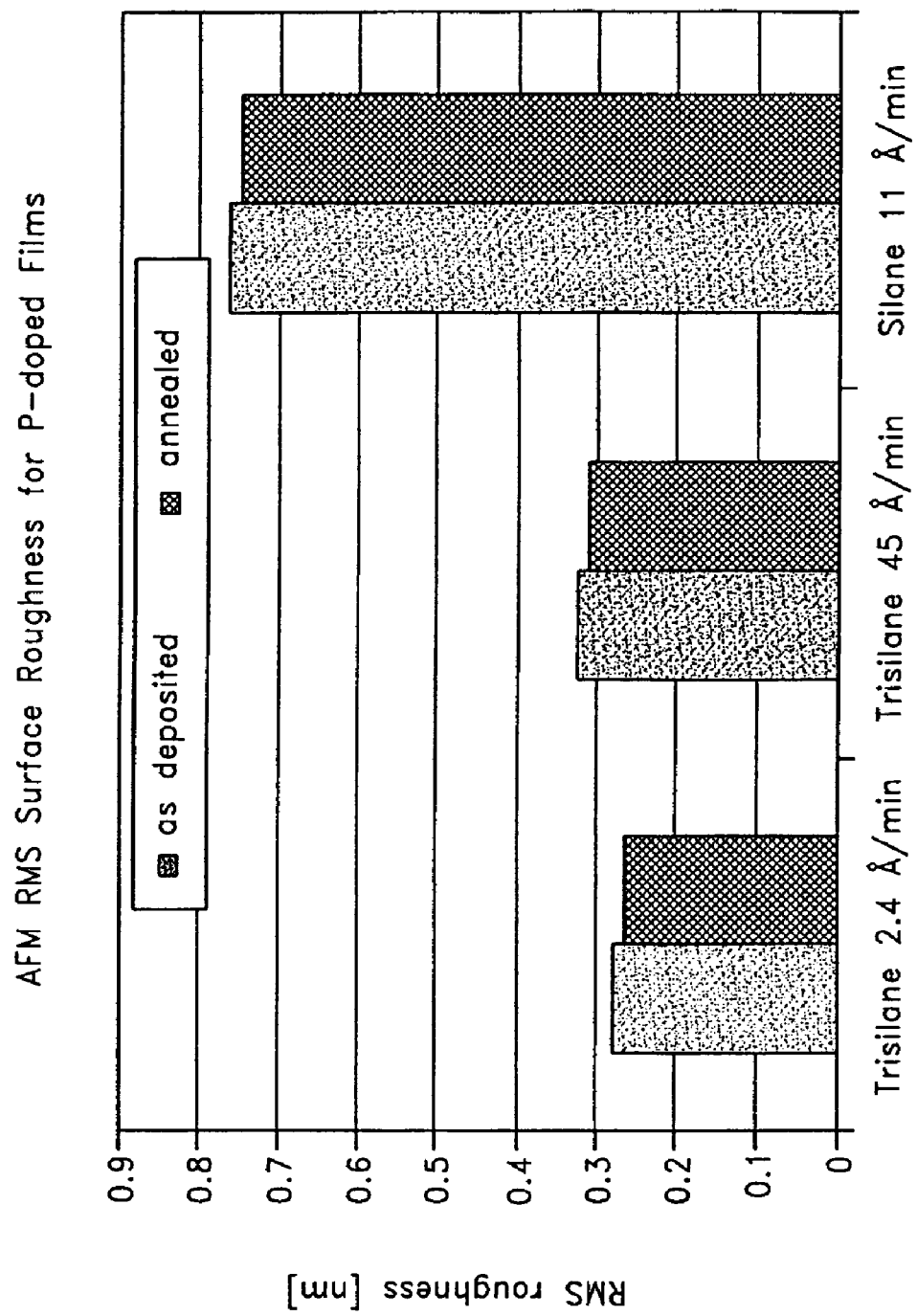
FIG. 12 shows the surface roughness for silicon films deposited using silane or trisilane as a silicon precursor.

FIG. 11 shows the improved nucleation behavior of depositions using trisilane as a silicon precursor. FIG. 11 shows Ti concentration as measured with Time Of Flight Secondary Ion Mass Spectroscopy (TOF SIMS) on a TiN film for different thicknesses of silicon layers deposited using trisilane over the TiN film. After depositing a silicon layer 40 Å thick, the amount of Ti that could be measured was negligible and essentially insignificant. The skilled artisan will also appreciate that the measurement technique is very surface sensitive, with a ion penetration depth of only 5 Å or less into the bulk of the film. Consequently, because the measurement technique actually penetrates into the film, the illustrated measurements indicate that the silicon films nucleated very well on the TiN underlayer and formed a substantially completely continuous, full coverage blanket film before a thickness of 40 Å was reached. For silicon films deposited with trisilane on a SiO$_2$ underlayer, similar results were achieved (not shown). In contrast, for silicon films deposited A doped silicon layer was deposited on a batch of wafers in a batch reactor. Seventy five product wafers having a diameter of 300 mm were held on holder rings in a wafer boat in the process chamber of an A412™ reactor. The trisilane was flowed at 60 sccm, PH$_3$ (1% in N$_2$) was flowed at 140 sccm, N$_2$ was flowed at 920 sccm into the process chamber. The process chamber pressure was 200 mTorr and the temperature was 450° C.

After a deposition time of 104 minutes, a film thickness of 242 Å was obtained, with the deposition rate being 2.33 Å/min. Advantageously, the deposited film was exceptionally uniform in thickness and exhibited excellent incorporation of phosphorus. The 1σ-uniformity of the film thickness was about 1% and the film had a phosphorus incorporation of about 3.1×10$^{20}$ atoms/cm$^3$.

Example 2

A doped silicon layer was deposited on a batch of substrates in a batch reactor. The reactor was an A412™ from ASM International N.V. of Bilthoven, The Netherlands. The process chamber pressure was 200 mTorr and the deposition temperature 450° C. A 60 sccm trisilane flow was mixed with a 1 slm N$_2$ carrier gas flow before introduction into the process chamber and a 60 sccm N$_2$ flow comprising 1% phosphine was used to provide the dopant precursor. The deposition rate was 2.4 Å/min and the phosphorus incorporation 2.1×10$^{20}$ atoms/cm$^3$. The deposition formed doped silicon films having a thickness of about 150 Å or less and, more preferably, about 100 Å or less.

Example 3

A doped silicon layer was deposited on a batch of wafers in a batch reactor. Seventy-five product wafers having a diameter of 300 mm were held on holder rings in a wafer boat in the process chamber of an A412™ reactor. The trisilane was flowed at 400 sccm, PH$_3$ (1% in N$_2$) was flowed at 400 sccm, N$_2$ was flowed at 200 sccm into the process chamber. The process chamber pressure was 200 mTorr and the temperature was 500° C. A deposition rate of 45 Å/min was achieved and the resulting film had a RMS roughness of 3.25 nm.

incorporation 2.1×10$^{20}$ atoms/cm$^3$. The deposition formed doped silicon films having a thickness of about 150 Å or less and, more preferably, about 100 Å or less.

Example 3

A doped silicon layer was deposited on a batch of wafers in a batch reactor. Seventy-five product wafers having a diameter of 300 mm were held on holder rings in a wafer boat in the process chamber of an A412™ reactor. The trisilane was flowed at 400 sccm, PH$_3$ (1% in N$_2$) was flowed at 400 sccm, N$_2$ was flowed at 200 sccm into the process chamber. The process chamber pressure was 200 mTorr and the temperature was 500° C. A deposition rate of 45 Å/min was achieved and the resulting film had a RMS roughness of 3.25 nm.

It will be appreciated that, while described with reference to various illustrated embodiments for ease for description, changes to the illustrated embodiments are possible. For example, the depositions can be performed in a reactor without a liner. In some arrangements, in such a reactor, process gases can be flowed into the reactor chamber at one vertical end and exhausted from the reactor at the opposite vertical end. In other arrangements, process gases can be flowed into such a process chamber through one or more vertically extending injectors and exhausted at a vertical end of the process chamber.

Furthermore, although advantageously applied to form n-type doped silicon layers, other in-situ doped layers can also be formed in accordance with the preferred embodiments. For example, germanium doped silicon films can also be formed by introducing a germanium precursor into a process chamber during the deposition of a silicon film using trisilane. Exemplary germanium precursors include germane (GeH$_4$).

Accordingly, it will be appreciated by those skilled in the art that various omissions, additions and modifications can be made to the processes described above without departing from the scope of the invention, and all such modifications and changes are intended to fall within the scope of the invention, as defined by the appended claims.

We claim:

1. A method of semiconductor processing, comprising:
   providing a substrate in a process chamber;
   depositing a silicon layer on the substrate by exposing the substrate to temporally-separated pulses of trisilane; and
   doping the silicon layer by continuously exposing the substrate to an n-type dopant precursor during and between the temporally-separated pulses of trisilane.

2. The method of claim 1, wherein depositing the silicon layer comprises maintaining reaction rate limited deposition conditions in the process chamber.

3. The method of claim 1, wherein depositing the silicon layer is performed at a temperature of less than about 500° C.

4. The method of claim 3, wherein the deposition rate is greater than 1 Å/min.

5. The method of claim 1, wherein the dopant precursor is a hydride.

6. The method of claim 5, wherein the dopant precursor is $PH_3$.

7. The method of claim 5, wherein the dopant precursor is $AsH_3$.

8. The method of claim 1, wherein an as-deposited surface roughness of the deposited in-situ doped silicon layer is greater than a substrate surface roughness by about 5 Å rms or less.

9. The method of claim 8, wherein the as-deposited surface roughness is greater than the substrate surface roughness by an amount of about 3 Å rms or less.

10. The method of claim 9, wherein the as-deposited surface roughness is greater than the substrate surface roughness by an amount of about 2 Å rms or less.

11. The method of claim 1, wherein doping the silicon layer results in a doping level of about $4.00 \times 10^{20}$ atoms/cm$^3$ or more.

12. The method of claim 11, wherein the doping level is about $5.00 \times 10^{20}$ atoms/cm$^3$.

13. The method of claim 11, wherein a 1σ-uniformity of the doping level is about 1% or less.

14. The method of claim 1, wherein a 1σ-uniformity of a thickness of the layer is about 1% or less.

15. The method of claim 1, wherein depositing the silicon layer and doping the silicon layer form a doped silicon layer having a thickness of about 150 Å or less.

16. The method of claim 15, wherein the thickness is about 100 Å or less.

17. The method of claim 1, wherein less than 20 particles having a size of about 0.12 μm or greater are added per substrate.

18. The method of claim 17, wherein less than 10 particles having a size of about 0.12 μm or greater are added per substrate.

19. A method for forming an integrated circuit, comprising:
   doping a silicon layer while depositing the silicon layer by continuously flowing a dopant precursor into a process chamber while exposing a substrate in the process chamber to temporally-separated pulses of trisilane.

20. The method of claim 19, wherein the dopant precursor is phosphine.

21. The method of claim 19, wherein the dopant precursor comprises germanium.

22. The method of claim 21, wherein the dopant precursor is germane.

23. The method of claim 19, wherein an incorporation of dopant into the silicon layer is substantially linear as a function of a partial pressure of the dopant in the process chamber.

24. The method of claim 19, wherein doping the silicon layer is performed at less than about 475° C.

25. The method of claim 19, wherein the deposition rate is greater than about 1 Å/min.

26. The method of claim 19, wherein depositing the silicon layer comprises forming a substantially completely continuous film before the silicon layer reaches a thickness of about 40 Å.

27. The method of claim 19, wherein depositing the silicon layer comprises flowing trisilane into the process chamber from a vertical injector, the vertical injector comprising a plurality of vertically distributed openings.

28. The method of claim 19, wherein the process chamber is a batch process chamber.

29. The method of claim 19, wherein doping a silicon layer while depositing the silicon layer deposits the silicon layer to a thickness of about 100 Å or less.

30. The method of claim 29, wherein doping the silicon layer results in a doping level of about $4.00 \times 10^{20}$ atoms/cm$^3$ or more.

31. The method of claim 30, wherein doping the silicon layer results in a doping level of about $5.00 \times 10^{20}$ atoms/cm$^3$.

* * * * *

UNITED STATES PATENT AND TRADEMARK OFFICE
CERTIFICATE OF CORRECTION

| | | |
|---|---|---|
| PATENT NO. | : 7,718,518 B2 | Page 1 of 1 |
| APPLICATION NO. | : 11/640471 | |
| DATED | : May 18, 2010 | |
| INVENTOR(S) | : Zagwijn et al. | |

It is certified that error appears in the above-identified patent and that said Letters Patent is hereby corrected as shown below:

On Page 2, Col. 1, line 3, under "U.S. Patent Documents," please change "4,720,385 A 1/1988 Foster" to --4,720,395 A 1/1988 Foster--.

On Page 3, Col. 1, line 8, under "Other Publications", please change "hetrostructures" to --heterostructures--.

On Drawing Sheet 8 of 12, FIG. 8 (besides Y axis), line 1, please change "Depostion" to --Deposition--.

On Drawing Sheet 8 of 12, FIG. 8 (besides Y axis), line 1, please change "Si O$_2$" to -- SiO$_2$--.

On Drawing Sheet 11 of 12, FIG. 11 (besides Y axis), line 1, please change "250000" to --2500000--.

In Col. 8, line 32, please change "altematingly" to --alternatingly--.

In Col. 11, line 52, delete "In contrast, for silicon films deposited".

In Col. 12, lines 27-29, delete "incorporation 2.1×10$^{20}$ atoms/cm$^3$. The deposition formed doped silicon films having a thickness of about 150 Å or less and, more preferably, about 100 Å or less."

Signed and Sealed this
Fourth Day of January, 2011

David J. Kappos
*Director of the United States Patent and Trademark Office*